(12) United States Patent
Forgey et al.

(10) Patent No.: US 7,690,106 B2
(45) Date of Patent: Apr. 6, 2010

(54) CERAMIC HEADER METHOD

(75) Inventors: Moody K. Forgey, Carrollton, TX (US); Mark A. Kressley, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 352 days.

(21) Appl. No.: 11/586,366

(22) Filed: Oct. 25, 2006

(65) Prior Publication Data
US 2008/0099240 A1    May 1, 2008

(51) Int. Cl.
*H05K 3/30* (2006.01)
*H01L 21/00* (2006.01)

(52) U.S. Cl. ............................. 29/832; 29/825; 29/840; 438/121

(58) Field of Classification Search .................... 29/825, 29/832, 840; 438/121
See application file for complete search history.

(56) References Cited

U.S. PATENT DOCUMENTS

| | | | |
|---|---|---|---|
| 3,649,872 A | 3/1972 | Garboushian | |
| 6,906,407 B2 * | 6/2005 | Byers et al. | 257/686 |
| 7,042,623 B1 | 5/2006 | Huibers et al. | |
| 7,411,282 B2 * | 8/2008 | Furuyama et al. | 257/678 |
| 2005/0230795 A1 * | 10/2005 | Furuyama et al. | 257/678 |
| 2005/0279166 A1 | 12/2005 | Shizuno | |
| 2006/0065635 A1 | 3/2006 | Derderian et al. | |
| 2008/0185733 A1 * | 8/2008 | Furuyama et al. | 257/777 |

OTHER PUBLICATIONS

"Clean" processing of polymers and smoothing of ceramics by pulsed leaser melting, by V.N. Takarev et al , J. Appll Physics, 77 (9), May 1, 1995, pp. 4714-4723.*

* cited by examiner

*Primary Examiner*—C. J Arbes
(74) *Attorney, Agent, or Firm*—Charles A. Brill; Wade James Brady, III; Frederick J. Telecky, Jr.

(57) ABSTRACT

A ceramic header configured to form a portion of an electronic device package includes a mounting portion configured to provide a mounting surface for an electronic device. In addition, the ceramic header includes one or more conductive input-output connectors operable to provide electrical connections from a first surface of the ceramic header to a second surface of the ceramic header. The ceramic header also includes one or more thermally polished surfaces.

10 Claims, 2 Drawing Sheets

CERAMIC HEADER METHOD

TECHNICAL FIELD

This invention relates in general to ceramic packages and, in particular, to thermally polished ceramic packages for electronic devices.

BACKGROUND

A wide variety of high reliability and high performance electronic devices utilize ceramic packaging. Micromechanical devices or microelectromechanical systems ("MEMS") extensively use ceramic-type packaging to form a hermetic seal. The fabrication of ceramic packages typically includes grinding the edges of a ceramic header, which often generates particles that can become dislodged or mobile. Contact between mobile particles and electronic devices may cause catastrophic failure, especially with MEMS devices, which often have micro-scale or nano-scale ("NEMS") moving parts.

SUMMARY OF THE EXAMPLE EMBODIMENTS

In one embodiment, a ceramic header configured to form a portion of an electronic device package includes a mounting portion configured to provide a mounting surface for an electronic device. In addition, the ceramic header includes one or more conductive input-output connectors operable to provide electrical connections from a first surface of the ceramic header to a second surface of the ceramic header. The ceramic header also includes one or more thermally polished surfaces.

In a method embodiment, a method for packaging an electronic device includes thermal polishing one or more edges of a ceramic header. The ceramic header has a mounting portion located on an outer surface of the ceramic header and operable to provide a mounting surface for at least one electronic device. In addition, the ceramic header has one or more conductive input-output connectors operable to provide electrical connections from a first surface of the ceramic header to a second surface of the ceramic header. The method further includes coupling at least one electronic device to the ceramic header. The method also includes coupling a capping element to the ceramic header such that the capping element and ceramic header enclose at least a portion of the at least one electronic device.

Technical advantages of some embodiments of the invention may include the mitigation or even elimination of mobile ceramic particles, thereby potentially increasing the reliability of ceramic-packaged devices and potentially decreasing the occurrence of latent or out-of-box failures. In addition, teachings of some embodiments of the invention may reduce time and expenses associated with particle level monitoring.

It will be understood that the various embodiments of the present invention may include some, all, or none of the enumerated technical advantages. In addition, other technical advantages of the present invention may be readily apparent to one skilled in the art from the figures, description, and claims included herein.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

In accordance with the teachings of the present invention, a ceramic header having one or more thermally polished surfaces and a method for the same are provided. In particular embodiments of the present invention, electronic devices utilizing a thermally polished ceramic header may exhibit increased reliability.

Particular examples and dimensions specified throughout this document are intended for example purposes only, and are not intended to limit the scope of the present disclosure. In particular, this document is not intended to be limited to a particular spatial light modulator device, such as, a digital micromirror device. Moreover, the illustrations in FIGS. 1 through 4 are not necessarily drawn to scale.

Figure 1:
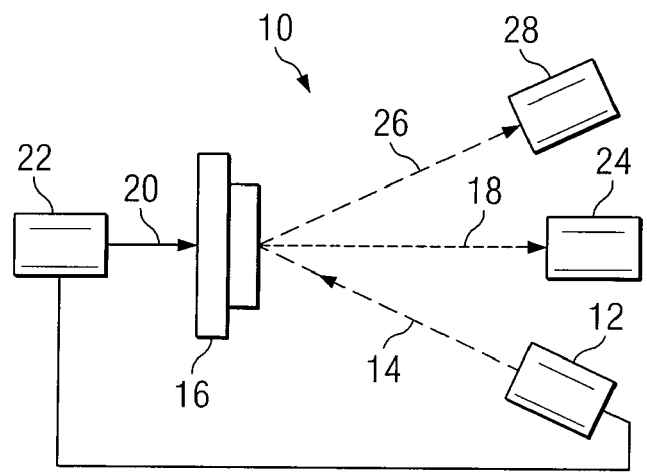
FIG. 1 is a cross-sectional block diagram of one embodiment of a portion of a light processing system.

FIG. 1 is a cross-sectional block diagram of one embodiment of a portion of a light processing system 10 according to the teachings of the invention. The display system 10 of FIG. 1 generally includes a light source module 12, a modulator 16, a light absorber 28, a projection lens 24, and control circuitry 22. In various embodiments, modulator 16 may spatially modulate light received from light source module 12 to produce an image projected by projected lens 24. As explained further below, a ceramic header forms a portion of the package for modulator 16.

The light source module 12 is capable of generating illumination light beams 14. Light beams 14 are directed from light source module 12 to a modulator 16. Modulator 16 may comprise any device capable of selectively communicating at least some of the received light beams along a projection light path 18. In various embodiments, modulator 16 may comprise a spatial light modulator, such as, for example, a liquid crystal display, an interferometric modulator, or a liquid crystal on silicon display. In the illustrated embodiment, however, modulator 16 comprises a digital micromirror device (DMD™), sometimes known as a deformable micromirror device. Of course, modulators other than DMDs 16 depicted and described in detail herein may advantageously utilize the principles of the present disclosure.

DMD 16 includes a microelectromechanical systems (MEMS) microchip comprising an array of hundreds of thousands of deformable micromirrors. In the illustrated embodiment, deformation of each micromirror between "on" and "off" positions is effected by the attractive or repulsive electrostatic forces exerted thereon by electric fields. The electric fields result from the application of appropriate potentials 20 as applied by control circuitry 22.

In the illustrated embodiment, incident illumination light on the micromirror array is reflected by the "on" micromirrors along projection path 18 for receipt by projection lens 24. Additionally, illumination light beams 14 are reflected by the "off" micromirrors and directed on off-state light path 26 toward light absorber 28. The pattern of "on" versus "off" mirrors (e.g., light and dark mirrors) forms an image that is projected by projection lens 24.

In this particular embodiment, the MEMS microchip of DMD 16 mounts on a ceramic header. As explained further below, the ceramic header forms a backplane portion of a hermetically sealed package and provides electrical interfaces to the microchip encased within the package. Control circuitry 22 applies potentials 20 to the microchip through these interfaces.

Conventional ceramic header processing typically includes a grinding process sometime after firing and metallizing the ceramic header. The grinding process often generates particles (e.g., micron-sized aluminum-oxide particles) that may temporarily cling to the edges and/or surfaces of the grounded ceramic. If these particles become mobile, they may limit reliability by migrating to chips or components subsequently mounted to the ceramic header. Mobile particles that migrate onto chips frequently cause catastrophic failure. This propensity for failure due to migrating particles is especially true of chips that have moving parts, such as micromirrors. Because particles may migrate after a chip is packaged, such failure may be latent and difficult to detect or predict. Various attempts at mitigating this problem have proven inadequate for some high-end applications such as DMD. Accordingly, teachings of some embodiments of the invention recognize that utilization of a thermal polish is particularly effective in mitigating or even eliminating particle issues associated with ceramic headers in general.

Figure 2:
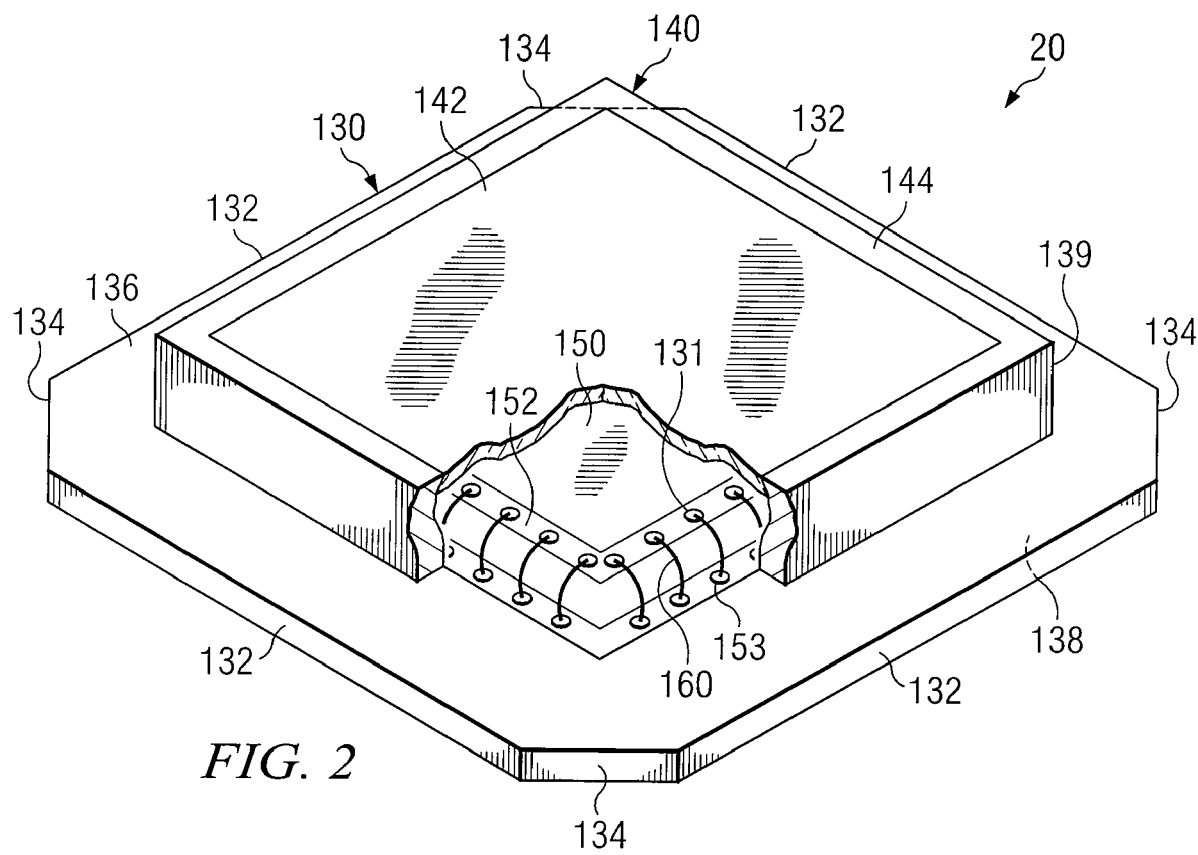
FIG. 2 is a perspective view of one embodiment of a ceramic header that forms a portion of a hermetic package of a device that may be used in the system of FIG. 1.
Figure 3:
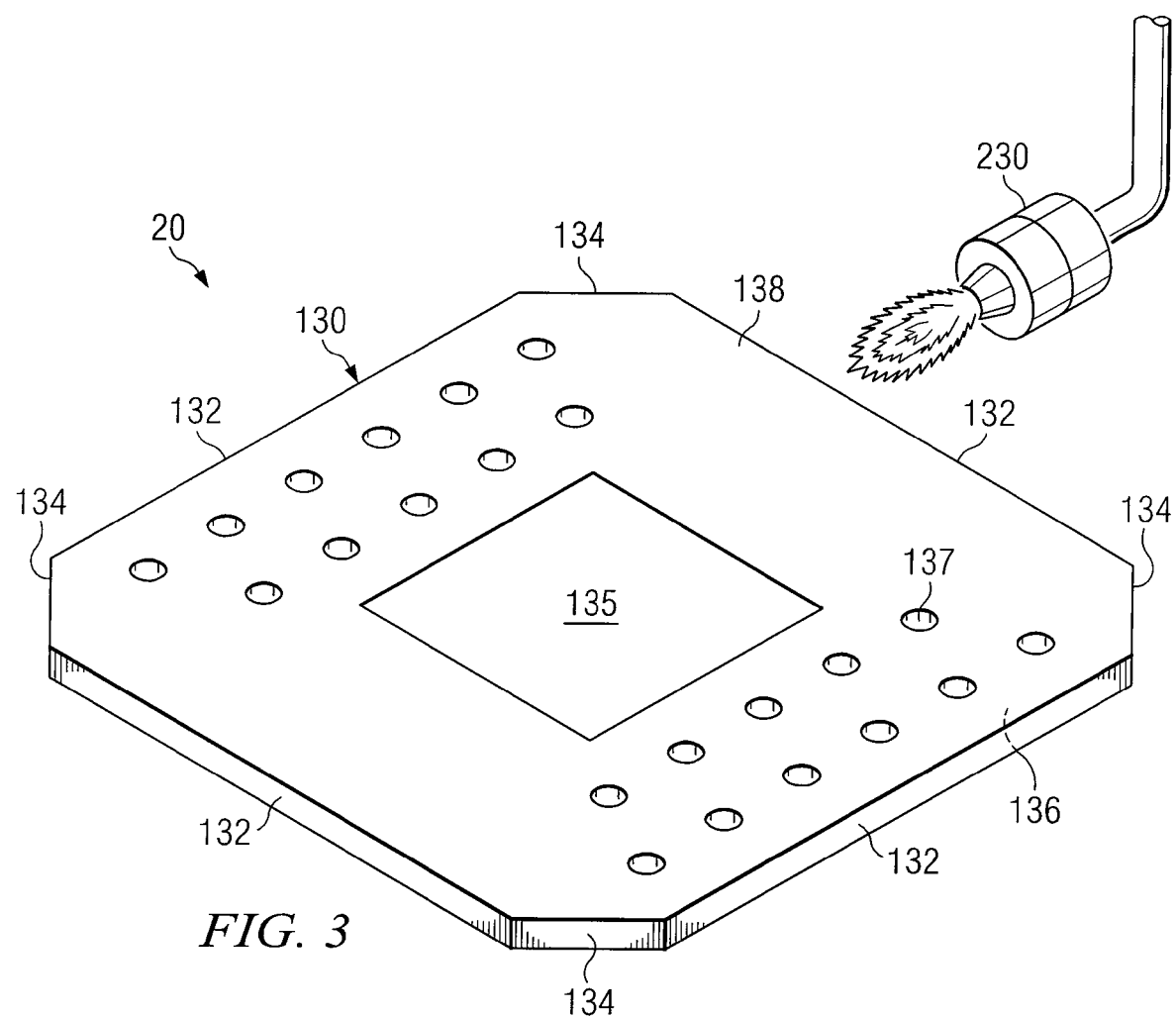
FIG. 3 is a perspective view of one embodiment of a portion of the ceramic header of FIG. 2, illustrating the opposite face of that illustrated in FIG. 2.

A better understanding of the various aspects of the present invention may be had by referring to FIGS. 2 and 3, which illustrate various perspective views of particular example embodiments comprising a thermally polished ceramic header.

FIG. 2 is a perspective view of one embodiment of ceramic header 130 that forms a portion of a hermetic package of a device 16. Device 16 generally includes one or more electronic devices or chips 150 at least partially enclosed within a cavity formed between a capping substrate 140 and ceramic header 130. In this particular embodiment, device 16 is substantially similar in structure and function to modulator 16 of FIG. 1.

Chip 150 may include one or more electronic devices. In various embodiments, chip 150 can include micro-scale and/or nano-scale moving parts. For example, chip 150 may include accelerometers, gyroscopes, and pressure sensors. In the illustrated embodiment, however, chip 150 comprises a DMD chip having an array of hundreds of thousands of deformable or moveable micromirrors. Of course, electronic devices other than DMD chip 150 depicted and described in detail herein may advantageously utilize the principles of the present disclosure.

In the illustrated embodiment, chip 150 is surface mounted to a planar mounting surface of a face 136 of ceramic header 130. Inner connector sites 131 disposed on or within face 136 facilitate electrical connection between ceramic header 130 and chip 150. The electrical connection between connector sites 153 on chip 150 and inner connector sites 131 is typically effected by wire bonds 160; however, any other suitable electrical interconnection technique may be used without departing from the scope of the present disclosure.

Capping substrate 140 may be formed from any suitable material used in semiconductor packaging that forms at least a portion of a hermetic seal, such as, for example, silicon, ceramics, metals, glass, or any combination thereof. In the illustrated embodiment, capping substrate 140 comprises transparent glass 142 disposed outwardly from chip 150 and fused to a metallic perimeter 144.

Ceramic header 130 may comprise any suitable ceramic material used in electronic device packaging. In the illustrated embodiment, ceramic header forms at least a portion of a hermetic seal and comprises at least 90% aluminum oxide. Forming ceramic header 130 may be effected by any of a variety of processes. For example, ceramic header 130 can be formed by pressing ceramic powder into the desired shape and then firing. In the illustrated embodiment, however, ceramic header 130 comprises a plurality of confronting ceramic layers, (not explicitly shown), that are metallized and co-fired to form a solid monolithic geometric form having a plurality of faces, (e.g., face 136), and edges 132 and 134. The metallization process is described further with respect to FIG. 3.

Although typically the ceramic header 130 body is generally of cubic, hexagonal, or octagonal shape, the body may be of any other solid geometric form having at least one planar face 136 that provides a mounting surface for chip 150. Additionally, face 136 can be configured to receive discrete electrical components such as chip capacitors, chip resistors and/or thick film resistors and capacitors. In the illustrated embodiment, a plurality of beveled edges 134 assist in reducing particles generated during assembly and test of device 16.

In the illustrated embodiment, ceramic header 130 also comprises a metallized seal ring 139 disposed between the periphery of chip 150 and edges 132 and configured to mate with metallic perimeter 144. Hermetic encapsulation of chip 150 is typically effected by welding metallized seal ring 139 to metallic perimeter 144.

FIG. 3 is a perspective view of a portion of the ceramic header 130 of FIG. 2, illustrating the opposite face 138 of that illustrated in FIG. 2. In this particular embodiment, ceramic header 130 generally has edges 132 and 134, a face 138, and metallized areas including a plurality of input-output (I/O) connectors 137, and a heat sink coupler 135.

In this particular embodiment, heat sink coupler 135 comprises a bottom-brazed metallic surface that is approximately flush with face 138 and in thermal conducting relation with the mounting surface disposed on or within the top face 136 of ceramic header 130. Heat sink coupler 150 is operable to facilitate dissipation of at least a portion of the heat generated by chip 150 during operation.

In this particular embodiment, outer connectors 137 provide a plurality of outer-package, electrical connections to chip 150 encased within device 16. The electrical connections are typically effected through electrically interconnecting selected ones of the outer connectors 137 with selected inner connectors 131 of FIG. 2. That is, in this particular embodiment, ceramic header 130 includes conductive paths (not explicitly shown) disposed within and between each layer of the multilayered ceramic header 130 that interconnects outer connectors 137 with respective inner connectors 131. Outer connectors 137 are typically brazed to the ceramic header 130 body in an annular shape. The metallized areas are then electro plated, usually with nickel followed by gold.

During fabrication, once ceramic header 130 is fired and metallized, it is typically mechanically polished. As previously mentioned, the mechanical polish often generates particles (e.g., micron-sized aluminum-oxide particles) that may temporarily cling a surface of ceramic header 130, including edges 132 and 134 and/or faces 136 and 138. In various embodiments, a variety of problems caused by the particles may be mitigated or eliminated by thermally polishing ceramic header 130.

The thermal polish of ceramic header 130 may be effected through any of a variety of processes. For example, the thermal polish may be effected using one or more flame sources 230 capable of generating sufficient localized heat to fuse ceramic particles together and/or to fuse particles to the surfaces of ceramic 130, including, for example, edges 132 and 134 and faces 136 and 138. In various other embodiments, the thermal polish may be effected using one or more lasers operable to generate heat comparable to flame source 230. In still other embodiments, the thermal polish process of ceramic header 130 may be effected through heat generated electro-thermally, such as, for example, by resistance. In various embodiments, the thermal polish may be applied locally to specific areas of ceramic header 130, and/or globally to the entire ceramic header 130, as in an oven. In some embodiments, global and/or local thermal processing may be effected by rapid thermal processing. Although the present disclosure provides several thermal polish examples, any combination thereof or any other thermal polish process sufficient to fuse ceramic particles of a fired or co-fired ceramic header may be used without departing from the scope of the present disclosure.

The heat associated with thermally polishing ceramic header 130 may comprise any suitable temperature sufficient to melt ceramic particles without damaging ceramic header 130. In one non-limiting example, the thermal polish can utilize a heat source capable of generating a localized temperature in the range of approximately 1700 to 2300° C. Because of the temperatures involved, thermal polishes can be performed on ceramic headers 130 at some point before the assembly processes associated with the remainder of device 16. In addition, thermal polishes can be performed on ceramic headers 130 after mechanical-type processing, such as, for example, grinding polishes. However, the thermal polish process may be performed at any appropriate time without departing from the scope of the present disclosure.

Although the present invention has been described in several embodiments, a myriad of changes, variations, alterations, transformations, and modifications may be suggested to one skilled in the art, and it is intended that the present invention encompass such changes, variations, alterations, transformations, and modifications as falling within the spirit and scope of the appended claims.

What is claimed is:

1. A method for packaging an electronic device, comprising:
   thermal polishing at least a portion of a ceramic header having:
      a mounting portion operable to provide a mounting surface for at least one electronic device and one or more conductive input-output connectors operable to provide electrical connections from a first surface of the ceramic header to a second surface of the ceramic header;
   coupling at least one electronic device to the ceramic header; and
   coupling a capping element to the ceramic header such that the capping element and ceramic header enclose at least a portion of the at least one electronic device.

2. The method of claim 1, wherein thermal polishing comprises laser polishing.

3. The method of claim 1, wherein thermal polishing comprises flame polishing.

4. The method of claim 1, wherein thermal polishing comprises electro-thermal polishing.

5. The method of claim 1, further comprising, prior to thermal polishing, mechanically polishing the at least a portion of the ceramic header.

6. The method of claim 5, and further comprising:
   generating one or more ceramic particles by the mechanically polishing; and
   fusing, by the thermal polishing, the one or more ceramic particles to one or more surfaces of the ceramic header.

7. The method of claim 1, wherein at least 90% of the composition of the ceramic header is aluminum-oxide.

8. The method of claim 1, wherein coupling a capping element comprises coupling a transparent panel.

9. The method of claim 1, wherein coupling a capping element comprises welding the capping element to the ceramic header.

10. The method of claim 1, wherein coupling a capping element to the ceramic header such that the capping element and ceramic header enclose at least one device selected from the group consisting of:
    a deformable micromirror device;
    a liquid crystal display;
    a liquid crystal on silicon device;
    an accelerometer;
    a gyroscope;
    a pressure sensor; and
    an optical switch.

* * * * *